US011963381B2

United States Patent
Ban et al.

(10) Patent No.: US 11,963,381 B2
(45) Date of Patent: Apr. 16, 2024

(54) DISPLAY SUBSTRATE AND DISPLAY PANEL WITH BARRIER SEPARATED FROM PIXEL

(71) Applicant: BOE Technology Group Co., Ltd., Beijing (CN)

(72) Inventors: Shengguang Ban, Beijing (CN); Pinfan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1197 days.

(21) Appl. No.: 16/611,466

(22) PCT Filed: Apr. 2, 2019

(86) PCT No.: PCT/CN2019/081006
§ 371 (c)(1),
(2) Date: Nov. 6, 2019

(87) PCT Pub. No.: WO2020/098204
PCT Pub. Date: May 22, 2020

(65) Prior Publication Data
US 2022/0376207 A1    Nov. 24, 2022

(30) Foreign Application Priority Data
Nov. 14, 2018    (CN) ......................... 201811353169.X (51) Int. Cl.
*H10K 50/844*    (2023.01)
*H10K 59/131*    (2023.01)

(52) U.S. Cl.
CPC ......... *H10K 50/844* (2023.02); *H10K 59/131* (2023.02)

(58) Field of Classification Search
CPC ........................... H10K 50/844; H10K 59/131
See application file for complete search history.

(56) References Cited

U.S. PATENT DOCUMENTS

| 2002/0185967 A1 | 12/2002 | Friend |
| 2014/0217371 A1* | 8/2014 | Kim ................. H10K 59/122 438/26 |

(Continued)

FOREIGN PATENT DOCUMENTS

| CN | 105390525 A | 3/2016 |
| CN | 107026244 A | 8/2017 |

(Continued)

OTHER PUBLICATIONS

EP19836780 Supplementary European Search Report and Search Opinion.

(Continued)

*Primary Examiner* — Lex H Malsawma
(74) *Attorney, Agent, or Firm* — IPro, PLLC (57) ABSTRACT

Disclosed herein is a display substrate comprising: a support; a pixel on the support and with a thin-film transistor (TFT) therein; and a barrier on the support, surrounding the pixel, and separated from the pixel by a trench; wherein the barrier comprises a protrusion extending from the support and configured to retard invasion of moisture and oxygen into the pixel; wherein the protrusion comprises a layer coplanar with a layer of the TFT. Also disclosed herein are a display panel with this display substrate and a system with this display panel.

18 Claims, 7 Drawing Sheets

(56) References Cited

U.S. PATENT DOCUMENTS

| | | |
|---|---|---|
| 2016/0064691 A1 | 3/2016 | Lee et al. |
| 2016/0204185 A1* | 7/2016 | Iijima .................. H10K 59/131 |
| | | 257/91 |
| 2016/0260928 A1 | 9/2016 | Choi et al. |
| 2016/0285038 A1 | 9/2016 | Kim |
| 2017/0033312 A1* | 2/2017 | Kim .................... H10K 59/131 |
| 2017/0040306 A1* | 2/2017 | Kim ...................... H05K 1/181 |
| 2017/0148845 A1 | 5/2017 | Lee et al. |
| 2017/0148856 A1* | 5/2017 | Choi .................... H10K 50/844 |
| 2017/0213872 A1 | 7/2017 | Jinbo et al. |
| 2017/0221982 A1 | 8/2017 | Park |
| 2017/0323936 A1 | 11/2017 | Lee et al. |
| 2018/0046221 A1* | 2/2018 | Choi ..................... G06F 1/1637 |
| 2018/0061910 A1 | 3/2018 | Cai |
| 2019/0296261 A1 | 9/2019 | Lee et al. |
| 2019/0296262 A1 | 9/2019 | Lee et al. |
| 2019/0392786 A1* | 12/2019 | Chida .................. H10K 59/131 |
| 2020/0006684 A1* | 1/2020 | Liu ....................... H10K 71/00 |
| 2020/0144357 A1 | 5/2020 | Park et al. |

FOREIGN PATENT DOCUMENTS

| | | |
|---|---|---|
| CN | 107221549 A | 9/2017 |
| CN | 108511621 A | 9/2018 |
| CN | 108777258 A | 11/2018 |
| CN | 107068715 B | 12/2019 |

OTHER PUBLICATIONS

CN201811353169_OA2.
CN201811353169_OA2_EN.
JP2022504993A first office action.
CN201811353169X-OA1.
CN201811353169X-OA1-EN.
PCTCN2019081006-ISR.
IN201937051183 first office action.

\* cited by examiner

DISPLAY SUBSTRATE AND DISPLAY PANEL WITH BARRIER SEPARATED FROM PIXEL

TECHNICAL FIELD

The disclosure herein relates to the field of display technology, and more particularly to a display substrate, a preparation method thereof, and a display panel comprising the same.

BACKGROUND

With the development of the display technology, the organic light emitting diodes (OLEDs) display will gradually replace the liquid crystal displays (LCDs).

With the development of the wearable technology, the stretchable OLED displays have become the future direction of development.

SUMMARY

Disclosed herein is a display substrate comprising: a support; a pixel on the support and with a thin-film transistor (TFT) therein; and a barrier on the support, surrounding the pixel, and separated from the pixel by a trench; wherein the barrier comprises a protrusion extending from the support and configured to retard invasion of moisture and oxygen into the pixel; wherein the protrusion comprises a layer coplanar with a layer of the TFT.

According to an embodiment, the support comprises a plurality of islands and a plurality of bridges connecting the islands; wherein the pixel is on one of the islands.

According to an embodiment, the barrier has a gap configured to accommodate wiring leading into the pixel from outside of the pixel.

According to an embodiment, the protrusion comprises a layer of metal, a layer of dielectric, or any combination thereof.

According to an embodiment, the barrier does not comprise any layer extending into the pixel.

According to an embodiment, the protrusion comprises a recess into a sidewall of the protrusion.

According to an embodiment, the recess is a volume defined by a first layer, a second layer and a third layer of the protrusion; wherein the second layer is sandwiched between the first layer and the third layer; wherein the first layer and the third layer extend to the sidewall but the second layer does not extend to the sidewall.

According to an embodiment, the pixel and the barrier each comprise a layer of the same material.

Disclosed herein is a display substrate comprising: a support; a pixel on the support and with a thin-film transistor (TFT) therein; and a barrier on the support and surrounding the pixel; wherein the barrier comprises a protrusion extending from the support and configured to retard invasion of moisture and oxygen into the pixel; wherein the protrusion comprises a recess into a sidewall of the protrusion; wherein the protrusion comprises a layer coplanar with a layer of the TFT.

According to an embodiment, the support comprises a plurality of islands and a plurality of bridges connecting the islands; wherein the pixel is on one of the islands.

According to an embodiment, the barrier has a gap configured to accommodate wiring leading into the pixel from outside of the pixel.

According to an embodiment, the protrusion comprises a layer of metal, a layer of dielectric, or any combination thereof.

According to an embodiment, the barrier does not comprise any layer extending into the pixel.

According to an embodiment, the recess is a volume defined by a first layer, a second layer and a third layer of the protrusion; wherein the second layer is sandwiched between the first layer and the third layer; wherein the first layer and the third layer extend to the sidewall but the second layer does not extend to the sidewall.

According to an embodiment, the pixel and the barrier each comprise a layer of the same material.

Disclosed herein is a display panel, comprising any of the display substrates above, and an encapsulation layer over the pixel and the barrier.

According to an embodiment, the display panel further comprises a coating at least partially covering the protrusion.

According to an embodiment, the coating comprises a discontinuity separating two discontinuous portions of the coating.

According to an embodiment, the discontinuity extends along an entire length of the barrier.

Disclosed herein is a system comprising the display panel above, wherein the system is an e-book reader, a laptop computer, a computer monitor, an OLED panel, a mobile phone, a tablet computer, a television, a display screen, a digital photo frame, or a portable GPS system.

Disclosed herein is a method of making a display substrate of a display panel, the method comprising: forming a barrier on a support; wherein the barrier surrounds a pixel on the support; wherein the barrier comprises a protrusion extending from the support and configured to retard invasion of moisture and oxygen into the pixel.

According to an embodiment, the method further comprises forming an encapsulation layer over the pixel and the barrier.

According to an embodiment, forming the barrier comprises forming a coating on the protrusion.

According to an embodiment, forming the barrier comprises forming a recess into a sidewall of the protrusion.

According to an embodiment, the pixel comprises a light emitter and a thin-film transistor (TFT); wherein forming the barrier comprises forming a layer of the barrier and a layer of the light emitter or of the TFT by depositing the same material and at the same time.

According to an embodiment, the method further comprises disconnecting the layer of the barrier and the layer of the light emitter or of the TFT.

DETAILED DESCRIPTION

In this disclosure, when a part is described as being between a first part and a second part, there may be or may not be an intermediate part between the part and the first or second part. When a part is described to be connected to another part, the part may be directly connected to the other part without an intermediate part, or may be indirectly connected to the other part with an intermediate part.

Stretchable OLED displays tend to exhibit relatively poor display quality because moisture and oxygen invasion into the luminescent layer has a negative impact on the performance of the luminescent layer.

Figure 1A:
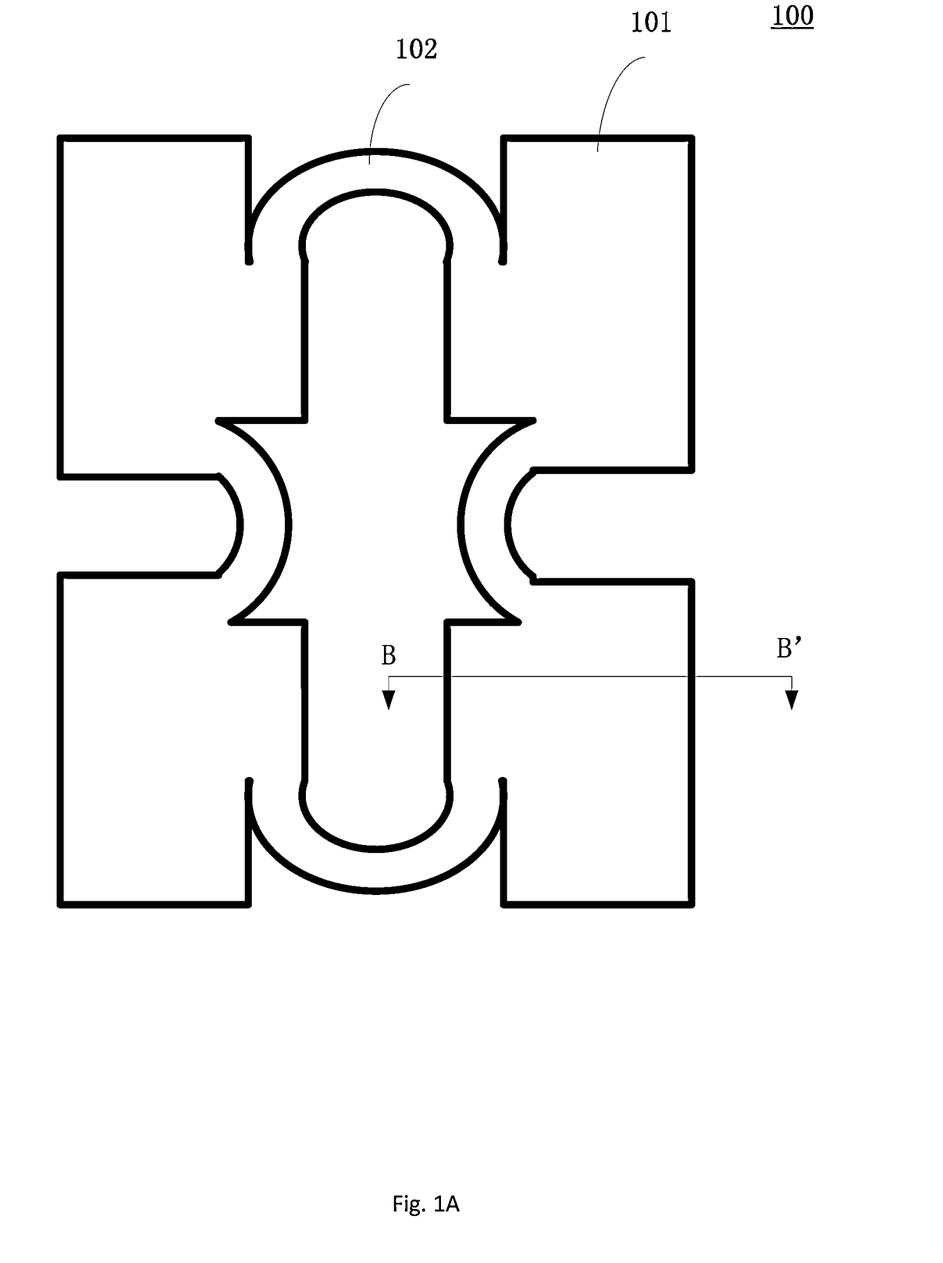
FIG. 1A is a top view of a display substrate according to an embodiment of the disclosure.
Figure 1B:
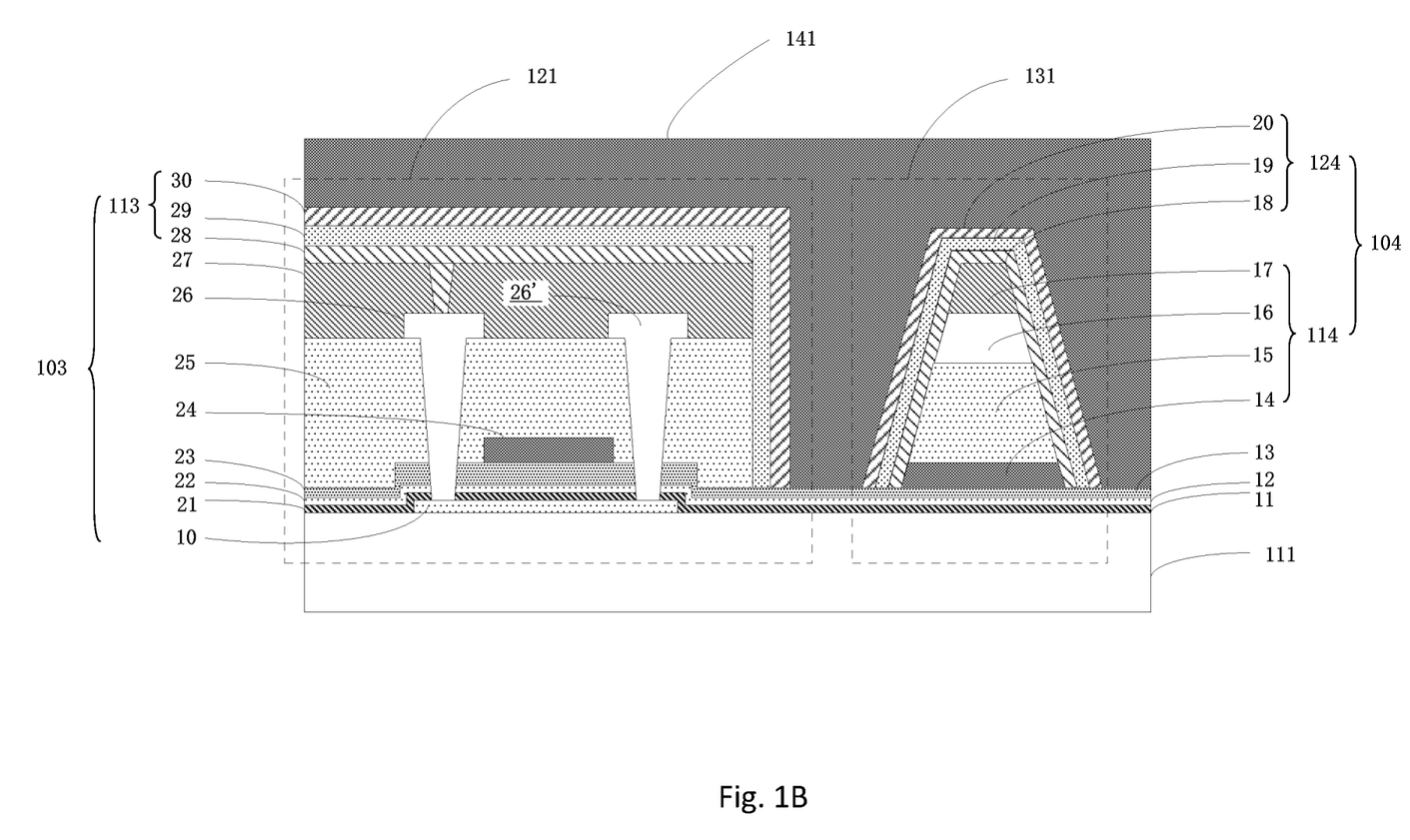
FIG. 1B is a sectional view of an island according to an embodiment of the disclosure.

FIG. 1A is a top view of a display substrate according to an embodiment of the disclosure. FIG. 1B is a sectional view of an island according to an embodiment of the disclosure. Specifically, FIG. 1B is a sectional view taken from line B-B' in FIG. 1A.

As shown in FIG. 1A, the display substrate 100 comprises a plurality of islands 101 and a plurality of bridges 102 connecting the islands 101. The bridges 102 are used for wiring, and the arrangement of the bridges 102 enables the display substrate 100 to be stretchable. At least one of the plurality of islands 101 in the display substrate 100 may be the island 101 shown in FIG. 1B.

As shown in FIG. 1B, the island 101 comprises a support 111 (for example, a flexible support of polyimide), a pixel area 121 on the support 111, and a barrier area 131 on the support 111 and surrounding the pixel area 121. FIG. 1B shows only a partial section of the barrier area 131. The pixel area 121 comprises at least one pixel 103, and the barrier area 131 comprises a barrier 104. The island 101 further comprises an encapsulation layer 141 over the pixel 103 and the barrier 104. For example, the encapsulation layer 141 may comprise alternating organic and inorganic layers. The encapsulation layer 141 may also fills the trench between the pixel 103 and the barrier 104.

Optionally, the distance between the edge of the pixel area 121 and the edge of the island 101 can be 10 microns to 50 microns, such as 20 microns, 40 microns, etc.

Figure 1C:
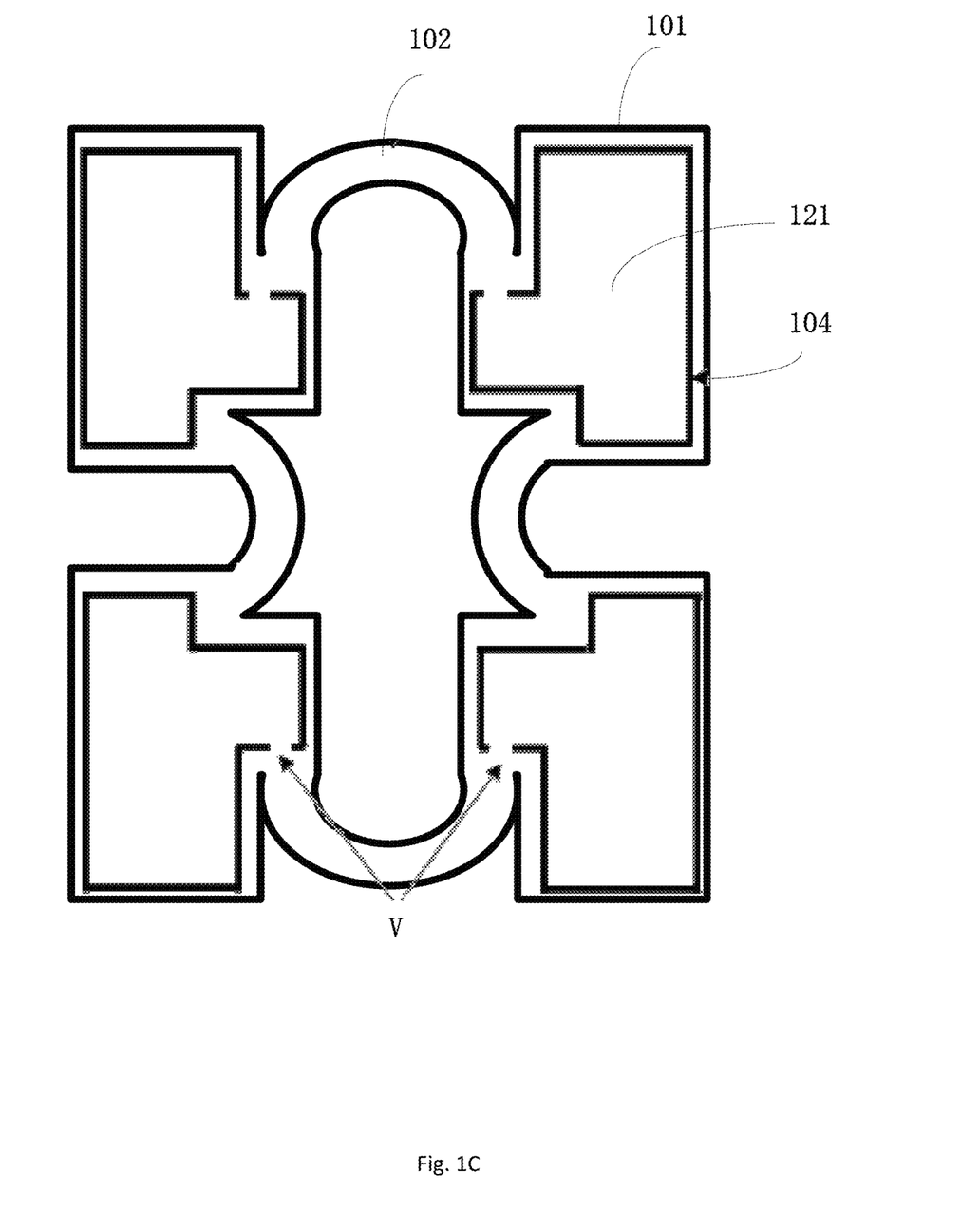
FIG. 1C is a top view of a barrier in an island according to an embodiment of the disclosure.

FIG. 1C is a top view of a barrier in the island according to an embodiment of the disclosure.

As shown in FIG. 1C, in certain embodiments, the barrier 104 has a gap V for wiring into the pixel 103 and the gap may be arranged at the joints of the bridge 102 and the barrier 104. Optionally, the distance between the barrier 104 and the pixel area 121 can be 1 micron to 5 microns, such as 2 microns, 4 microns, etc. As an example, the distance between the barrier 104 and the edge of the island 101 can be 3 microns to 15 microns, such as 5 microns, 10 microns, etc.

In an embodiment, at least one island comprises a barrier surrounding the pixel area. The barrier can retard the invasion of the moisture and oxygen around the island into the pixel area, so as to reduce the adverse effect on the performance of the pixel in the pixel area, and thus improve the display quality of the display panel.

In certain embodiments, as shown in FIG. 1B, the barrier 104 comprises a barrier body 114 and a coating 124 covering the barrier body 114. The barrier body 114 is a protrusion extending from the support 111. A lamination can be disposed between the barrier 104 and the support 111. For example, the lamination comprises a first dielectric layer 11, a metal layer 12, and a second dielectric layer 13 stacked sequentially in the direction away from the support 111. The first and second dielectric layers 11 and 13 may comprise silicon oxide layers (e.g. $SiO_2$), silicon nitride layers (e.g. $SiN_x$), or a lamination of silicon oxide layers and silicon nitride layers, with a thickness of 1000-5000 angstroms, e.g., 2000 angstroms, 3000 angstroms, etc.

The barrier body 114 and the coating 124 are detailed as follows.

In certain embodiments, in the direction away from the support 111 (that is, from bottom to top), the barrier body 114 comprises one or more of a first metal layer 14, a first insulation interlayer 15, a second metal layer 16, and a first flattening layer 17 superimposed sequentially. For example, in an embodiment, the barrier body 114 comprises a first metal layer 14, a first insulation interlayer 15, and a first flattening layer 17 superimposed from bottom to up. In another embodiment, the barrier body 114 comprises a first metal layer 14 and a second metal layer 16 superimposed from bottom to up. Optionally, the first metal layer 14 comprises Mo, Al, Ti or Cu layers with thickness ranging from 1000 angstroms to 5000 angstroms, such as 2000 angstroms, 4000 angstroms, etc. As an example, the materials of the first flattening layer 17 may include an organic material such as resins.

In certain embodiments, in the direction away from the support 111 (that is, from bottom to top), the coating 124 comprises one or more of a first electrode layer 18, a first luminescent layer 19 and a second electrode layer 20 sequentially covering the barrier body 114. The coating 124 may cover the upper surface of the uppermost layer of the barrier body 114 and the sides of each layer of the barrier body 114.

As an example, the first electrode layer 18 can be used as the material for OLED anode, such as a laminated layer comprising indium tin oxide (ITO)/Ag/ITO, the thickness of which can be 1000-5000 angstroms, for example, 2000 angstroms, 3000 angstroms, 4000 angstroms and so on. For example, the first luminescent layer 19 may comprise an organic luminescent material layer, and the first luminescent layer 19 may also comprise one or more of an electron transport layer, a hole transport layer, an electron injection layer, and a hole injection layer. The second electrode layer 20 can be used for OLED cathode materials, such as Mg—Ag alloy.

In certain embodiments, as shown in FIG. 1B, the pixel 103 comprises a light emitter 113. The light emitter 113 comprises a third electrode layer 28 on one side of the support 111, a second luminescence layer 29 on one side of the third electrode layer 28 away from the support 111, and a fourth electrode layer 30 on one side of the second luminescence layer 29 away from the third electrode layer 28. The fourth electrode layer 30 in the pixel 103 is separated from the second electrode layer 20 in the barrier 104. Such a structure can better block the moisture and oxygen around the island 101 from entering the pixel area 121 through the second electrode layer 20, thus reducing the adverse effects on the performance of the pixel 103 and improving the display quality of the display panel.

In certain embodiments, the second luminescence layer 29 can be separated from the first luminescence layer 19, and the third electrode layer 28 can be separated from the first electrode layer 18.

In certain embodiments, the two layers of at least one of the following three groups are prepared using the same composition process: the third electrode layer 28 and the first electrode layer 18, the second luminescence layer 29 and the first luminescence layer 19, the fourth electrode layer 30 and the second electrode layer 20. For example, the third electrode layer 28 and the first electrode layer 18 are formed by patterning the same material layer using the same composition process.

In certain embodiments, as shown in FIG. 1B, the pixel 103 comprises an active layer 10 on one side of the support 111, a gate layer 24 on one side of the active layer 10 away from the support 111, a second insulation interlayer 25 on one side of the gate layer 24 away from the active layer 10, a source 26 and a drain 26' running through the second insulation interlayer 25 and connected to the active layer 10, and a second flattening layer 27 on one side of the second insulation interlayer 25 away from the gate layer 24. In certain embodiments, the two layers of at least one of the following three groups are prepared using the same composition process: the first metal layer 14 and the gate layer 24, the first insulation interlayer 15 and the second insulation interlayer 25, the second metal layer 16 and source 26, the first flattening layer 17 and the second flattening layer 27.

Furthermore, the pixel 103 may also comprise a dielectric layer 21, a metal layer 22, and a dielectric layer 23 stacked from bottom to top between the active layer 10 and the gate layer 24, respectively.

Some layers in the pixel 103 constitute driving transistors, storage capacitors and other components in the pixel 103. For example, the drive transistors comprise an active layer 10, a dielectric layer 21 (as gate dielectric layer), a gate layer 24, a source 26 and a drain 26'. For example, the storage capacitors comprise a metal layer 22, a dielectric layer 23 and a gate layer 24.

Figure 2:
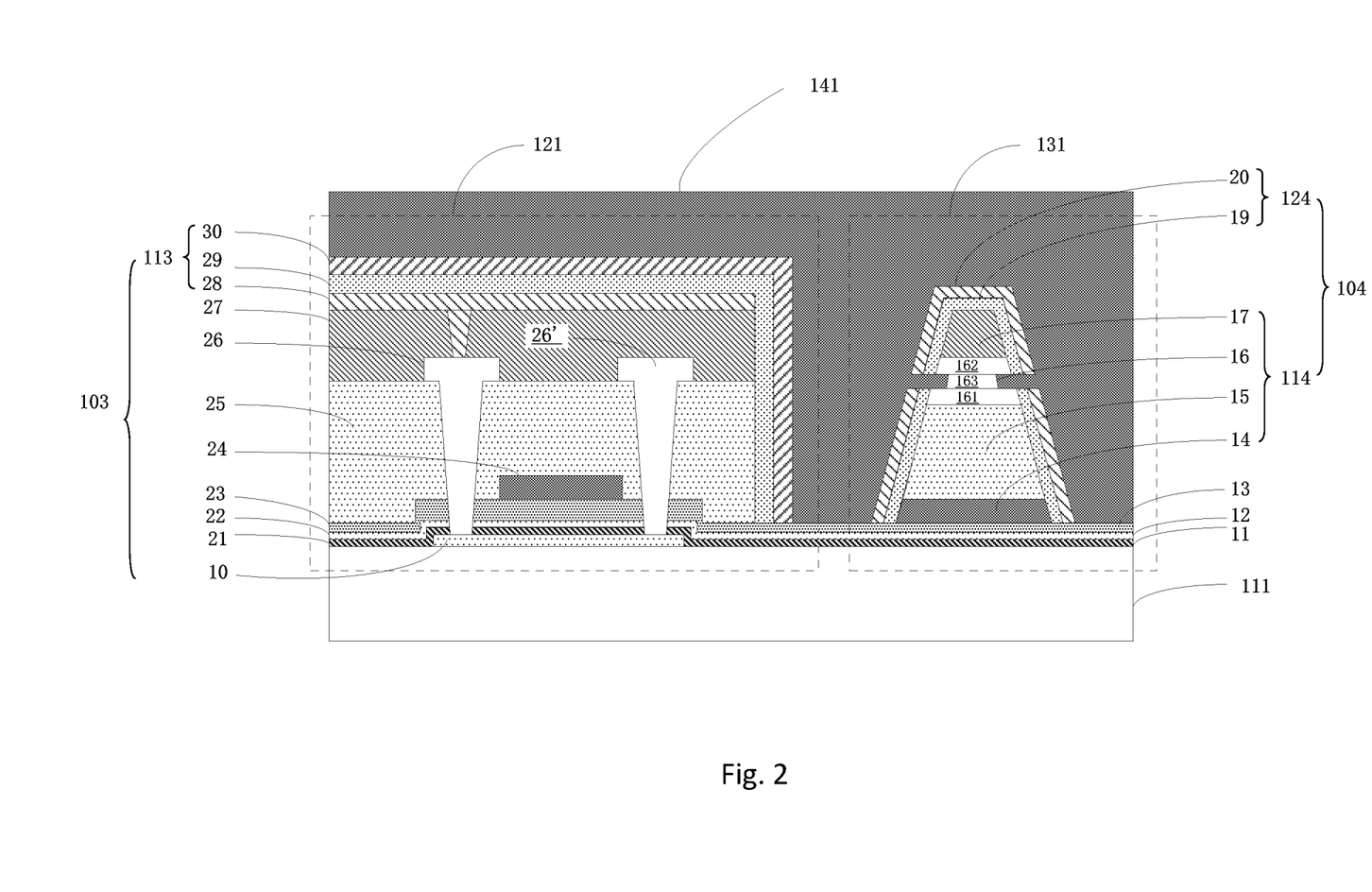
FIG. 2 is a sectional view of an island in another embodiment of the disclosure.

FIG. 2 is a sectional view of the island in another embodiment of the disclosure. The differences between FIG. 2 and FIG. 1 are described below. Other relevant points can refer to the above descriptions.

As shown in FIG. 2, the barrier body 114 comprises a second metal layer 16. The second metal layer 16 comprises a first layer 161, a second layer 162, and a third layer 163 located between the first layer 161 and the second layer 162. The first layer 161 and the second layer 162 may be a Ti layer, and the third layer 163 may be an Al layer.

The projections of the first layer 161, the second layer 162 and the third layer 163 on the support 111 are a first projection, a second projection and a third projection, respectively. Here, the first projection and the second projection cover the third projection, and the area of the first projection and the second projection is larger than the area of the third projection. In other words, at least one side of the third layer 163 is closer to the center of the third layer 163 than the side of the first layer 161 and the second layer 162. Namely, the barrier body 114 has a recess into the sidewall of the barrier body 114. The coating 142 thus may have a discontinuity at the recess, the discontinuity separating two discontinuous portions of the coating 142. The discontinuity may extend along an entire length of the barrier 104.

Furthermore, as shown in FIG. 2, the coating 124 comprises the first luminescent layer 19 covering the barrier body 114 and the second electrode layer 20 covering the first luminescent layer 19, excluding the first electrode layer 18.

Suppose the part of the barrier body 114 located on the side of the third layer 163 away from the support 111 is a first part, and the part of the barrier body 114 located on the side of third layer 163 close to the support 111 is a second part. The area of the second electrode layer 20 covering the first part is spaced from the area covering at least one side of the second part.

Herein, the area of the second electrode layer 20 covering the second part comprises two areas covering two sides of the second part (that is, the left and right areas below the third layer 163). The area of the second electrode layer 20 covering the first part is spaced from at least one of the two areas. FIG. 2 shows the area of the second electrode layer 20 covering the first part is spaced from both the two areas.

In aforesaid embodiments, the second electrode layer 20 in the barrier is discontinuous, and is divided into several separated areas, thus blocking the travel path of the moisture and oxygen. Even if the moisture and oxygen around the island enter the second electrode layer 20, it is difficult for the moisture and oxygen to enter the pixel 103 of the pixel area 121 through the second electrode layer 20. Such a structure can further improve the display quality of the display panel.

The disclosure also provides a method of preparing the display substrate. The method comprises forming a plurality of islands connected by bridges. At least one island can be formed according to the flow chat shown in FIG. 3.

Figure 3:
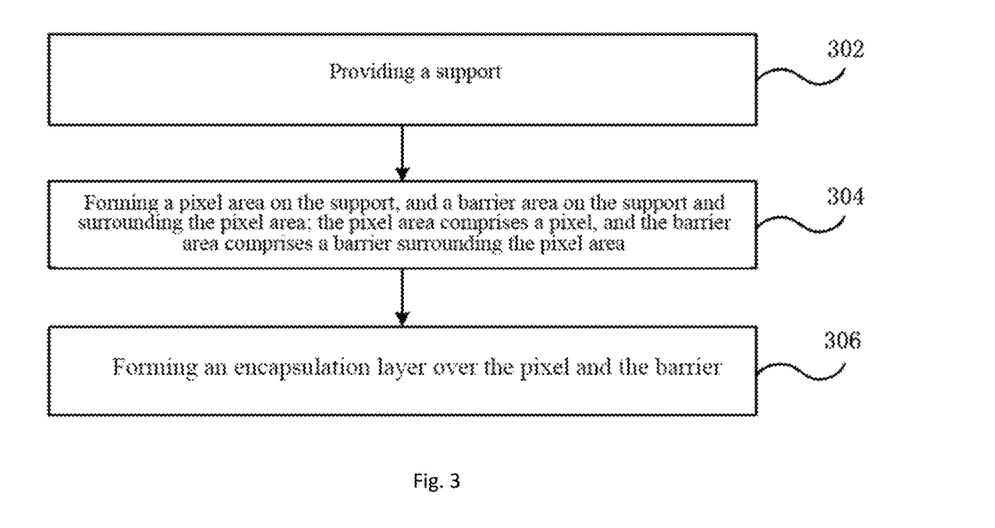
FIG. 3 is a flow chart of a method of forming an island of a display substrate of a display panel according to an embodiment of the disclosure.

FIG. 3 is a flow chart of a method of forming an island of a display substrate of a display panel according to an embodiment of the disclosure.

In 302, providing a support, for example, a flexible support.

In 304, forming a pixel area on the support, and a barrier area on the support and surrounding the pixel area. The pixel area comprises a pixel, and the barrier area comprises a barrier surrounding the pixel area.

In certain embodiments, different processes can be used to form the pixels and the barriers. For example, a second pixel and barrier can be formed following the formation of the first pixel and barrier.

In certain embodiments, the barrier may be formed in the process of forming a pixel.

In 306, forming an encapsulation layer over the pixel and the barrier.

In an embodiment, the island comprises a barrier surrounding the pixel area. The barrier can retard the invasion of the moisture and oxygen around the island into the pixel area, so as to reduce the adverse effect on the performance of the pixel in the pixel area, and thus improve the display quality of the display panel.

The following describes the process of forming barriers in accordance with certain embodiments of the disclosure.

First, forming a barrier body. The barrier body comprises, in the direction away from the support, one or more of a first metal layer, a first insulation interlayer, a second metal layer, and a first flattening layer superimposed sequentially.

In certain embodiments of the disclosure, the projection areas of the first metal layer, the first insulation interlayer, the second metal layer, and the first flattening layer on the support increases gradually. For example, the barrier body is trapezoid. For example, the angle between the side of the trapezoid and the surface of the support is less than 70 degrees, such as 65 degrees, 60 degrees, 50 degrees, etc. Such a structure is conducive to the formation of the lamination.

Second, forming a coating. The coating comprises, in the direction away from the support, one or more of a first electrode layer, a first luminescent layer and a second electrode layer sequentially covering the barrier body.

In certain embodiments of the disclosure, the coating is formed as follows: in the direction away from the support, sequentially forming the first electrode layer, the first luminescent layer and the second electrode layer covering the barrier body.

In certain embodiments of the disclosure, the second metal layer comprises a first layer, a second layer, and a third layer located between the first layer and the second layer. In this case, the coating is formed as follows: forming the first electrode layer covering the surface of the barrier body; performing an etching process to remove the first electrode layer and an exposed part of the third layer; and forming the first luminescent layer covering the surface of the barrier body and the second electrode layer covering the first luminescent layer. Herein, the part of the barrier body located on the side of the third layer away from the barrier area is a first part, and the part of the barrier body located on the side of third layer close to the barrier area is a second part. The area of the second electrode layer covering the first part is spaced from the area covering at least one side of the second part.

FIG. 4A-FIG. 4I show the structures obtained at each stage of forming a barrier according to embodiments of the disclosure.

Figure 4A:
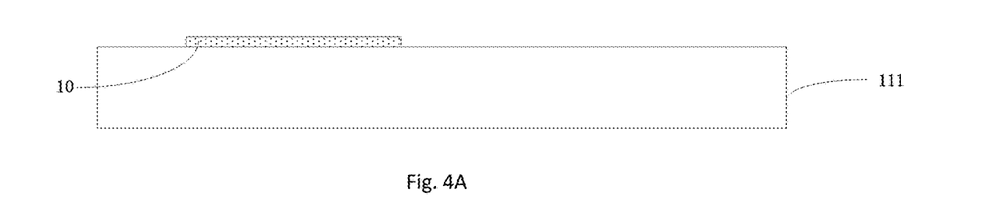
FIGS. 4A-FIG. 4I show the structures obtained at each stage of forming a barrier according to embodiments of the disclosure.

First, as shown in FIG. 4A, forming an active layer 10 configured to drive the transistors on the support 111, for example, polycrystalline silicon layer or amorphous silicon layer or the like.

In certain embodiments, a buffer layer may be formed on the support 111 prior to the formation of the active layer 10, for example, a lamination of a silicon oxide layer and a silicon nitride layer.

Figure 4B:
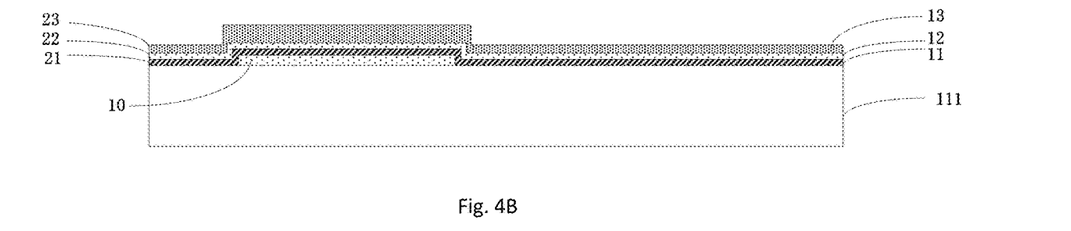

Second, as shown in FIG. 4B, sequentially forming a first dielectric material layer, a first metal material layer and a second dielectric material layer on the support 111.

The first dielectric material layer, the first metal material layer and the second dielectric material layer in the barrier area 131 are the first dielectric layer 11, the metal layer 12, and the second dielectric layer 13, respectively. The first dielectric material layer, the first metal material layer and the second dielectric material layer in the pixel area 121 are the dielectric layer 21, the metal layer 22, and the dielectric layer 23, respectively.

Figure 4C:
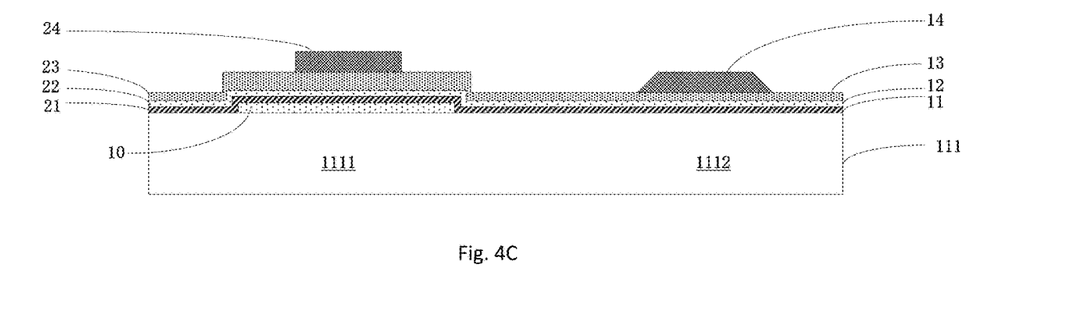

Further, as shown in FIG. 4C, forming a first metal layer on the second dielectric layer 13 and a gate layer 24 on the dielectric layer 23. Here the metal layer 22, the dielectric layer 23 and the gate layer 24 constitute a storage capacitor.

For example, a second metal material layer, such as Mo, Al, Ti or Cu, can be deposited on the structure shown in FIG. 4B. And then, the deposited second metal material layer is patterned to yield the first metal layer 14 and the gate layer 24.

Figure 4D:
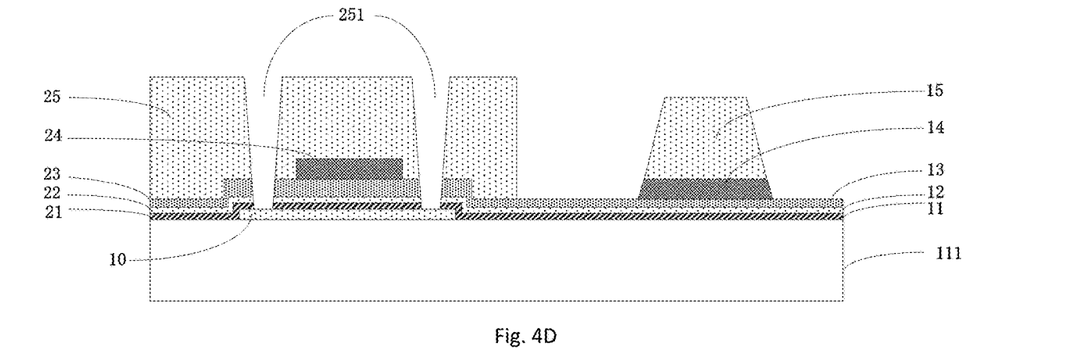

As shown in FIG. 4D, forming a first insulation interlayer 15 on the first metal layer 14 and the second insulation interlayer 25 with an opening 251 extending to the active layer 10.

For example, the insulation material layer can be deposited on the structure shown in FIG. 4C, and the deposited insulation material layer can be patterned to obtain the first insulation interlayer 15 and the second insulation interlayer 25. The insulation material layer may include, for example, a lamination comprising a silicon nitride layer and a silicon oxide layer.

Figure 4E:
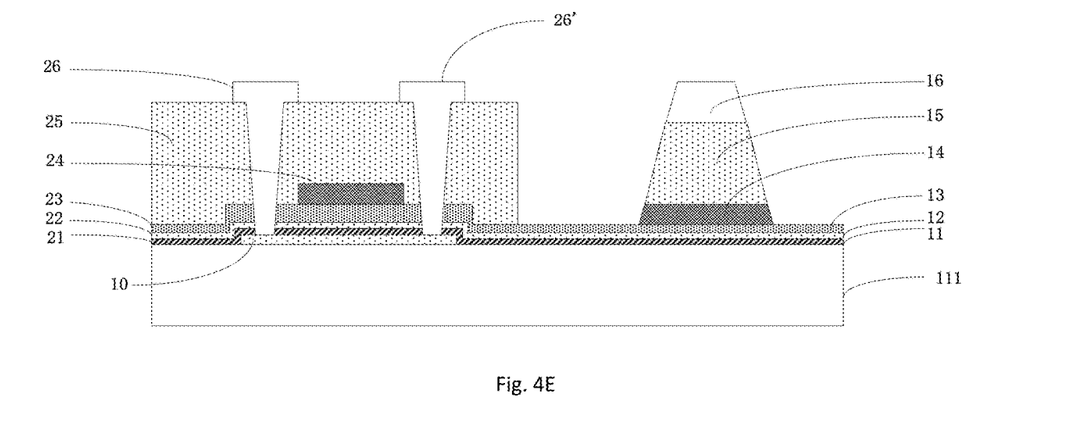

As shown in FIG. 4E, forming, on the first insulation interlayer 15, a second metal layer 16, and a source 26 and a drain 26' configure to fill the opening 251.

For example, a third metal material layer can be deposited on the structure shown in FIG. 4D, and the deposited third metal material layer can be patterned to obtain the second metal layer 16, the source 26 and the drain 26'. The third metal material layer can include Ti/Al/Ti lamination, etc.

Figure 4F:
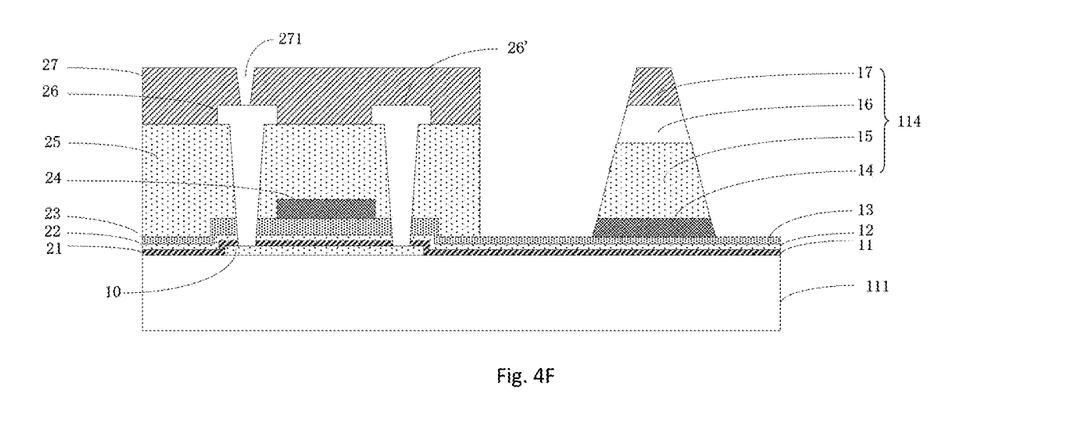

As shown in FIG. 4F, forming a first flattening layer 17 on the second metal layer 16 and a second flattening layer 27 on the second insulation interlayer 25. The second flattening layer 27 comprises an opening 271 extending to the source 26 and the drain 26'.

For example, a flattening material layer can be deposited on the structure shown in FIG. 4F and patterned to obtain the first flattening layer 17 and the second flattening layer 27. The flattening material layer may include, for example, a resin material layer.

To facilitate the subsequent description, the lamination comprising the first metal layer 14, the first insulation interlayer 15, the second metal layer 16 and the first flattening layer 17 is called a barrier body 114.

Figure 4G:
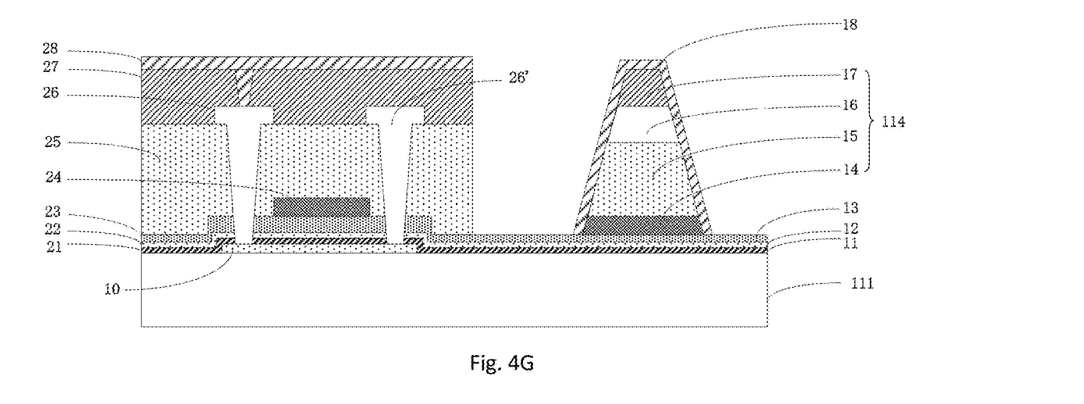

As shown in FIG. 4G, forming a first electrode layer 18 covering the surface of the barrier body 114 and a third electrode layer 28 on the first flattening layer 17.

In certain embodiments, the third electrode layer 28 can fill the opening 271. In other embodiments, the opening 271 can be filled with a conductive material to form a connector connected to a source 26 or drain 26'.

Figure 4H:
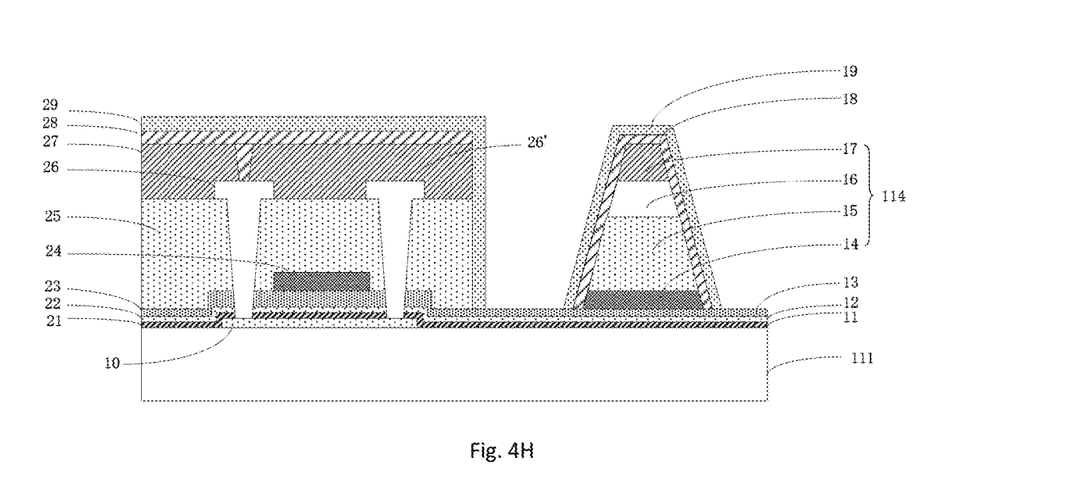

As shown in FIG. 4H, forming a first luminescent layer 19 covering the first electrode layer 18 and the second luminescent layer 29 covering the third electrode layer 28. In certain embodiments, the first luminescent layer 19 can be separated from the second luminescent layer 29.

For example, a luminescent material layer can be deposited on the structure shown in FIG. 4G, and then the luminescent material layer is patterned to form the first luminescent layer 19 and the second luminescent layer 29 which are spaced apart. For example, by controlling the distance between the barrier body 114 and the pixel area, the deposited luminescent material layer can automatically crack into the first luminescent layer 19 and the second luminescent layer 29 when the luminescent material layer is deposited on the structure shown in FIG. 4G.

Figure 4I:
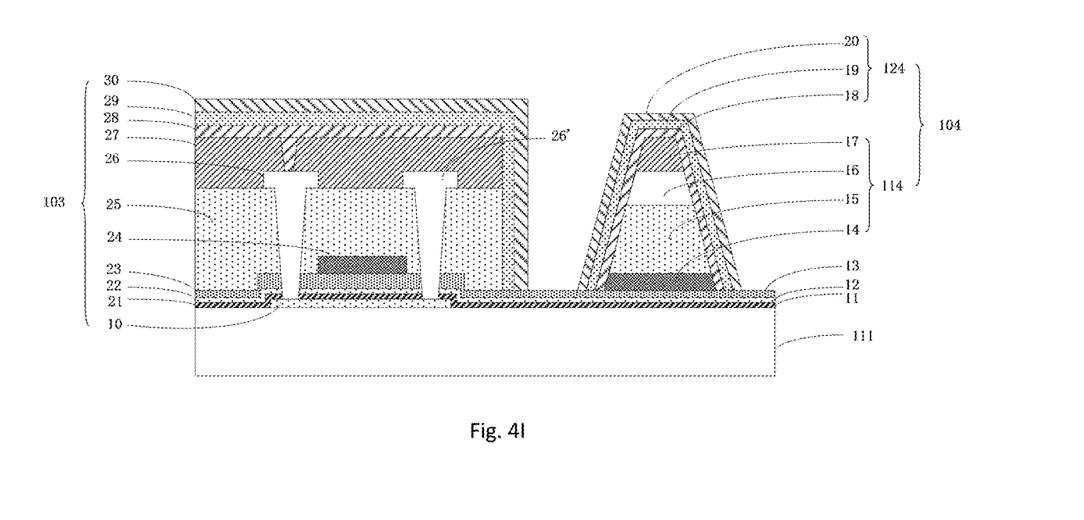

As shown in FIG. 4I, forming a second electrode layer 20 covering the first luminescent layer 19 and a fourth electrode layer 30 covering the second luminescent layer 29.

Here, the lamination comprising the first electrode layer 18, the first luminescent layer 19 and the second electrode layer 20 is called a coating 124.

The barrier 104 can be obtained by the processes shown in FIG. 4A-FIG. 4I. In the process of forming the pixel 103, the barrier 104 can be formed at the same time, which simplifies the operation and saves the cost.

The manufacturing process of the above barrier is only one example and is not intended to limit the disclosure.

The disclosure also provides a display system which comprises a display panel of any of the above-mentioned embodiments. In certain embodiments, the system may comprise, for example, a product or component with display function such as a mobile terminal, a television, a display screen, a tablet computer, a digital photo frame, a portable GPS, an electronic paper, etc.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A display substrate comprising:
   a support;
   a pixel on the support and with a thin-film transistor (TFT) therein; and a barrier on the support, surrounding the pixel, and separated from the pixel by a trench;

wherein the barrier comprises a protrusion extending from the support and configured to retard invasion of moisture and oxygen into the pixel;

wherein the protrusion comprises a layer coplanar with a layer of the TFT;

wherein the barrier has a gap therein configured to accommodate wiring leading into the pixel from outside of the pixel.

2. The display substrate of claim 1, wherein the support comprises a plurality of islands and a plurality of bridges connecting the islands;

wherein the pixel is on one of the islands.

3. The display substrate of claim 1, wherein the protrusion comprises a layer of metal, a layer of dielectric, or any combination thereof.

4. The display substrate of claim 1, wherein the barrier does not comprise any layer extending into the pixel.

5. The display substrate of claim 1, wherein the protrusion comprises a recess into a sidewall of the protrusion.

6. The display substrate of claim 5, wherein the recess is a volume defined by a first layer, a second layer and a third layer of the protrusion; wherein the second layer is sandwiched between the first layer and the third layer; wherein the first layer and the third layer extend to the sidewall but the second layer does not extend to the sidewall.

7. The display substrate of claim 1, wherein the pixel and the barrier each comprise a layer of the same material.

8. A display panel, comprising the display substrate of claim 1, and an encapsulation layer over the pixel and the barrier.

9. The display panel of claim 8, further comprising a coating at least partially covering the protrusion.

10. The display panel of claim 9, wherein the coating comprises a discontinuity separating two discontinuous portions of the coating.

11. The display panel of claim 10, wherein the discontinuity extends along an entire length of the barrier.

12. A system comprising the display panel of claim 8, wherein the system is an e-book reader, a laptop computer, a computer monitor, an OLED panel, a mobile phone, a tablet computer, a television, a display screen, a digital photo frame, or a portable GPS system.

13. A display substrate comprising:

a support;

a pixel on the support and with a thin-film transistor (TFT) therein; and a barrier on the support and surrounding the pixel;

wherein the barrier comprises a protrusion extending from the support and configured to retard invasion of moisture and oxygen into the pixel;

wherein the protrusion comprises a recess into a sidewall of the protrusion;

wherein the protrusion comprises a layer coplanar with a layer of the TFT;

wherein the barrier has a gap therein configured to accommodate wiring leading into the pixel from outside of the pixel.

14. The display substrate of claim 13, wherein the support comprises a plurality of islands and a plurality of bridges connecting the islands;

wherein the pixel is on one of the islands.

15. The display substrate of claim 13, wherein the protrusion comprises a layer of metal, a layer of dielectric, or any combination thereof.

16. The display substrate of claim 13, wherein the barrier does not comprise any layer extending into the pixel.

17. The display substrate of claim 13, wherein the recess is a volume defined by a first layer, a second layer and a third layer of the protrusion; wherein the second layer is sandwiched between the first layer and the third layer; wherein the first layer and the third layer extend to the sidewall but the second layer does not extend to the sidewall.

18. The display substrate of claim 13, wherein the pixel and the barrier each comprise a layer of the same material.

\* \* \* \* \*